United States Patent
Wikner et al.

(10) Patent No.: US 6,466,148 B1
(45) Date of Patent: Oct. 15, 2002

(54) D/A CONVERSION METHOD AND D/A CONVERTER

(75) Inventors: Jacob Wikner; Mark Vesterbacka, both of Linköping (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/672,608

(22) Filed: Sep. 28, 2000

(30) Foreign Application Priority Data

Sep. 28, 1999 (SE) .......................................... 9903500-8

(51) Int. Cl.[7] ................................................ H03M 1/66
(52) U.S. Cl. ........................ 341/144; 341/136; 341/138
(58) Field of Search ................................ 341/144, 136, 341/148, 899, 154

(56) References Cited

U.S. PATENT DOCUMENTS

| | | | |
|---|---|---|---|
| 4,393,370 A | * 7/1983 | Hareyama et al. | 341/136 |
| 4,490,634 A | * 12/1984 | Hareyama | 341/899 |
| 4,503,421 A | * 3/1985 | Hareyama et al. | 341/144 |
| 4,904,922 A | * 2/1990 | Colles | 341/136 |
| 4,910,514 A | 3/1990 | Irmer et al. | |
| 5,079,552 A | * 1/1992 | Pelgrom et al. | 341/148 |
| 5,105,193 A | * 4/1992 | Vogt et al. | 341/136 |
| 5,574,455 A | * 11/1996 | Hori et al. | 341/144 |
| 5,684,483 A | * 11/1997 | Giuroui | 341/154 |
| 5,844,515 A | 12/1998 | Park | |
| 5,929,798 A | 7/1999 | Baek | |

FOREIGN PATENT DOCUMENTS

| | | |
|---|---|---|
| DE | 36 12 693 | 10/1986 |
| EP | 0 043 897 | 1/1982 |

OTHER PUBLICATIONS

D. A. Johns and K. Martin, "Integrated analog circuit design", John Wiley & Sons, New York, 1997, pp. 469–484.

* cited by examiner

Primary Examiner—Pegut Jeanpierre
Assistant Examiner—Jean Bruner JeanGlaude
(74) Attorney, Agent, or Firm—Burns, Doane, Swecker & Mathis, L.L.P.

(57) ABSTRACT

A D/A converter includes a triangular unit weight array. A decoder transforms digital samples into control signals having a linearly weighted binary representation. These control signal are used for activation/deactivation of entire rows or columns of the triangular unit weight array. Finally, the unit weights are combined into an analog output signal.

8 Claims, 10 Drawing Sheets

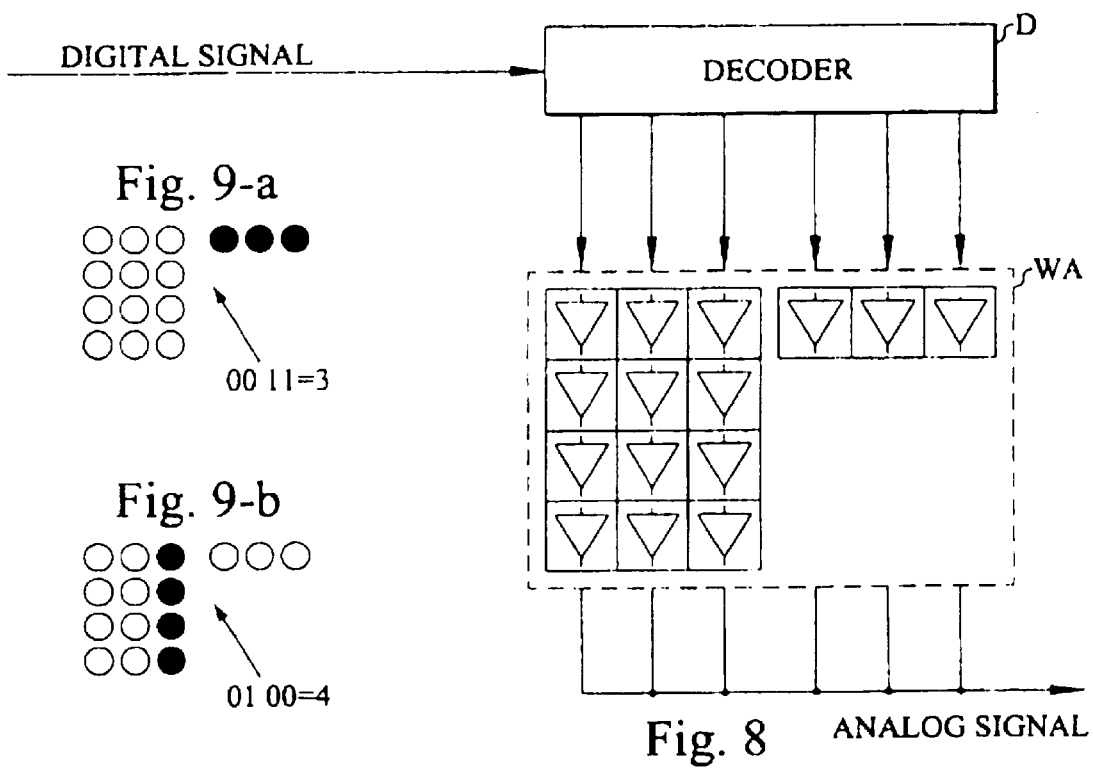
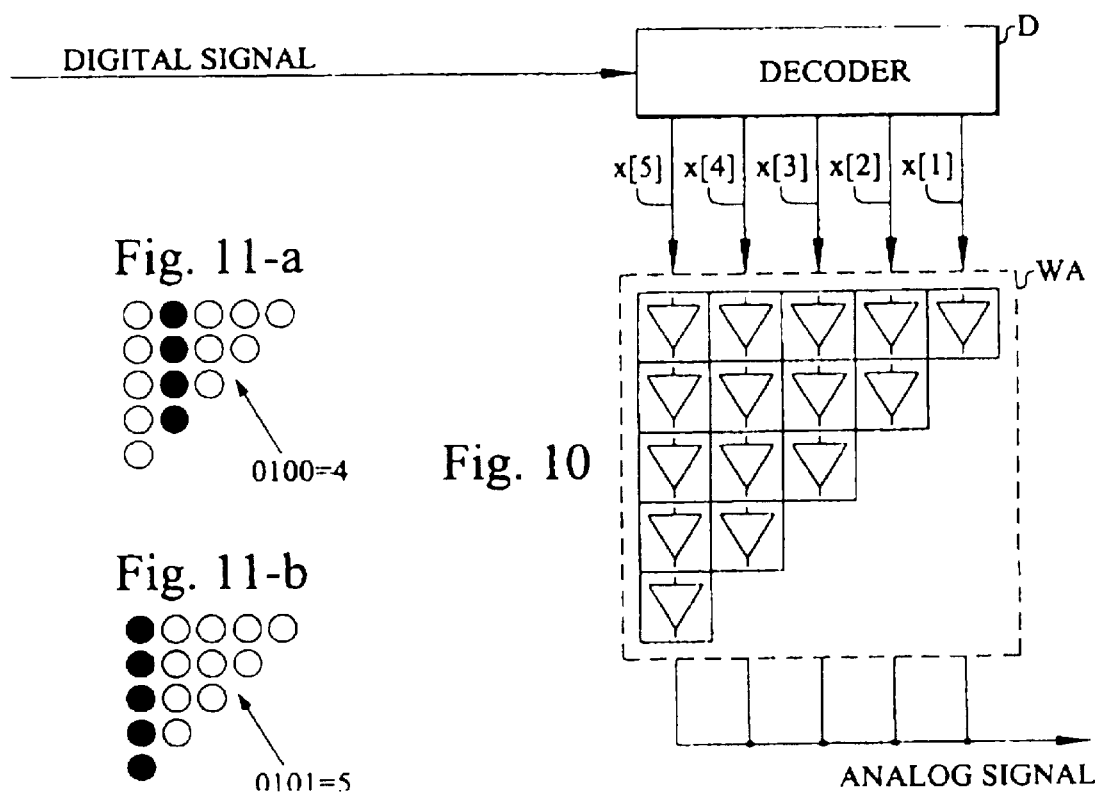

Fig. 13-a 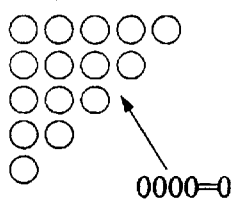
0000=0
Fig. 13-b 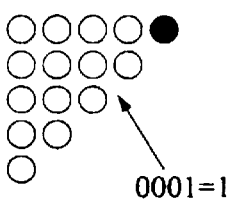
0001=1
Fig. 13-c 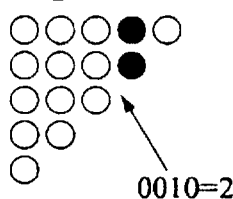
0010=2
Fig. 13-d 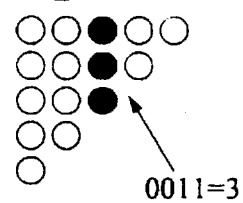
0011=3
Fig. 13-e 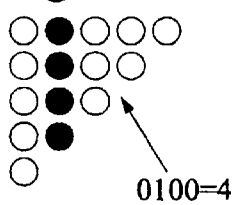
0100=4
Fig. 13-f 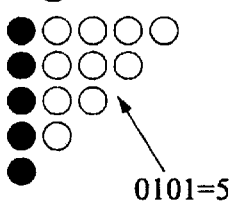
0101=5
Fig. 13-g 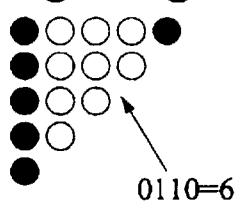
0110=6
Fig. 13-h 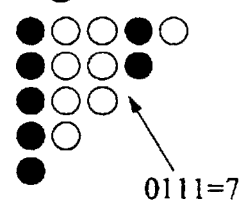
0111=7
Fig. 13-i 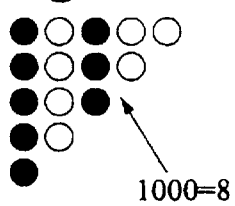
1000=8
Fig. 13-j 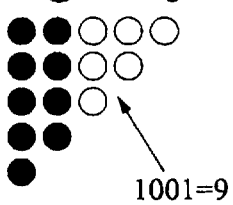
1001=9
Fig. 13-k 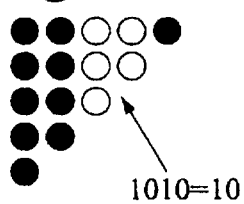
1010=10
Fig. 13-l 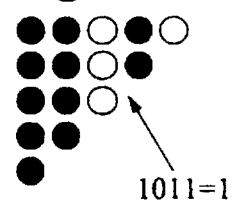
1011=11
Fig. 13-m 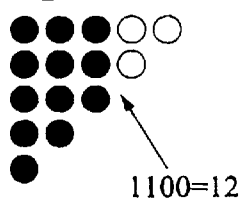
1100=12
Fig. 13-n 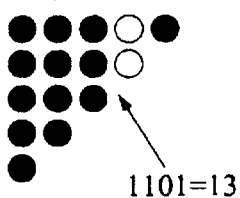
1101=13
Fig. 13-o 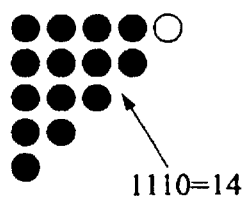
1110=14
Fig. 13-p 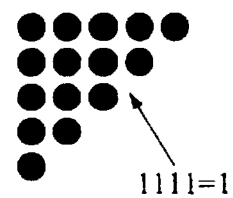
1111=15

Fig. 17   ANALOG SIGNAL ns and K. Martin, "Integrated Analog Circuit Design",
D/A CONVERSION METHOD AND D/A CONVERTER

BACKGROUND

The present invention relates to a digital-to-analog (D/A) conversion method and a D/A converter.

Typical conventional D/A converters are described in D. A. Johns and K. Martin, "Integrated Analog Circuit Design", John Wiley & Sons, New York 1997, pp. 469–484. A common type uses exponential weights (typically current, voltage or charge sources representing the weights $2^k$ of a digital number in conventional binary representation). In order to improve matching of the weights, these weights are often implemented as an array of unit weights. As discussed in Integrated Analog Circuit Design, a drawback of exponentially weighted D/A converters is the glitches that occur at so called major code transitions, such as between 011 ... 1 and 100 ... 0. Due to slight switching delays the output signal may, during a short time period, correspond to either the value 111 ... 1 (maximum value) or 000 ... 0 (minimum value). This effect is referred to as a glitch and becomes particularly disturbing at high-speed operation of the converter.

Integrated Analog Circuit Design also discusses suggested solutions to reduce glitching noise. One such solution is based on thermometer code or unary weighted code. This solution significantly reduces glitching noise, but requires complex decoders and extra logic at the unit weights.

Integrated Analog Circuit Design also discusses hybrids between these approaches. These hybrids are referred to as segmented D/A converters. Such converters typically use unary weights for a few of the most significant bits (MSB) and exponential weights for the remaining least significant bits (LSB). This solution also requires complex decoders and extra logic at the unit weights.

A variation of the hybrid converters discussed above is described in U.S. Pat. No. 4,910,514. In this implementation unary weighting is used by both the most and least significant bits, but with different weights. This implementation has the same drawbacks as the hybrid implementation.

SUMMARY

An object of the present invention is to provide a D/A conversion method and a D/A converter that reduce glitching noise and yet are less complex than the prior art This object is achieved in accordance with the attached claims.

Briefly, the present invention is based on linearly weighting instead of exponential or unary weighting. At high bit-resolution this gives excellent glitching performance at low complexity. Furthermore, this principle also easily provides redundancy, thereby significantly reducing systematic errors due to unit weight-mismatch.

BRIEF DESCRIPTION OF THE DRAWINGS

The invention, together with further objects and advantages thereof, may best be understood by making reference to the following description taken together with the accompanying drawings, in which:

FIGS. 5-a–5-b illustrate a major code transition in the unary weighted D/A converter of FIG. 4;

FIGS. 7-a–7-b illustrate a major code transition in the segmented D/A converter of FIG. 6;

FIG. 8 is a block diagram illustrating the principles of another array-based segmented D/A converter;

FIGS. 9-a–9-b illustrate a major code transition in the segmented D/A converter of FIG. 8;

FIG. 10 is a block diagram illustrating the principles of an array-based linearly weighted D/A converter in accordance with the present invention;

FIGS. 11-a–11-b illustrate a major code transition in the linearly weighted D/A converter of FIG. 10;

FIGS. 13-a–13-p illustrate possible unit weight array configurations for a 4-bit linearly weighted D/A converter in accordance with the present invention;

DETAILED DESCRIPTION

In the following description different types of D/A converters will be illustrated. In order to keep the drawings manageable the bit-resolution has been kept very low, typically only 3–4 bits. In actual implementations of such D/A converters the resolution is much higher, typically 8–14 bits or more. This means that certain features of the different designs can not be judged directly from the drawings alone. Instead it is important to refer to the description when comparing the different D/A converter types.

Furthermore, in order to simplify the description elements that perform similar or corresponding functions have been assigned the same reference designations throughout the drawings. However, it should be kept in mind that internally these elements may be implemented very differently and be of different complexity.

Figure 1:
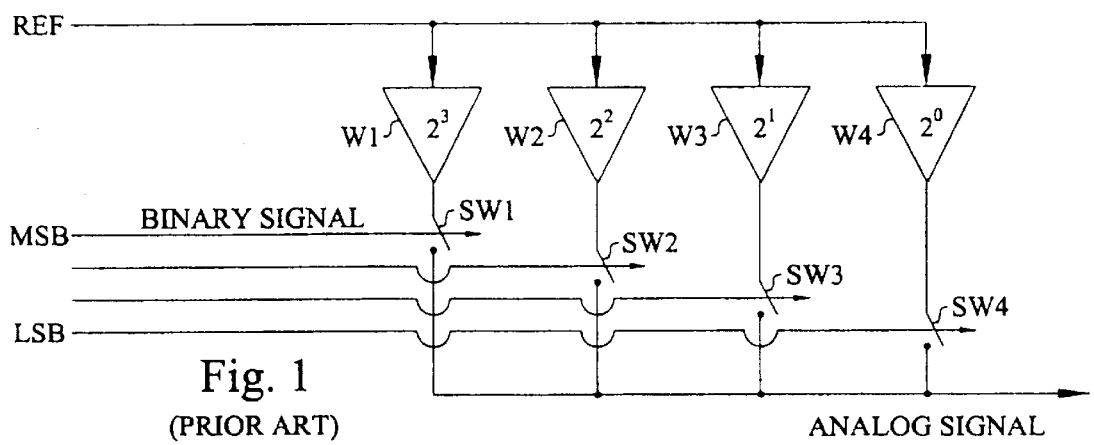
FIG. 1 is a block diagram illustrating a prior art exponentially weighted D/A converter.

FIG. 1 is a block diagram illustrating a prior art exponentially weighted D/A converter. The illustrated D/A converter has a resolution of N=4 bits. A set of sources or weights W1–W4 are controlled by a corresponding set of switches SW1–SW4. These switches are controlled by the individual bits of the digital signal. The analog signal is formed by the sum of the output signals from the sources or weights. The sources or weights may, for example, be based on current, charge or voltage (resistance). In the following description the term weight will be used to cover all possibilities. Thus, the analog signal x may be written as $$x = \sum_{k=0}^{N-1} x[k] \cdot 2^k$$

where N denotes the bit resolution and x[k] denote the individual bits of the binary signal. As can be seen from this formula the individual bits of the digital signal are exponentially weighted (by the factors $2^k$).

Figure 2:
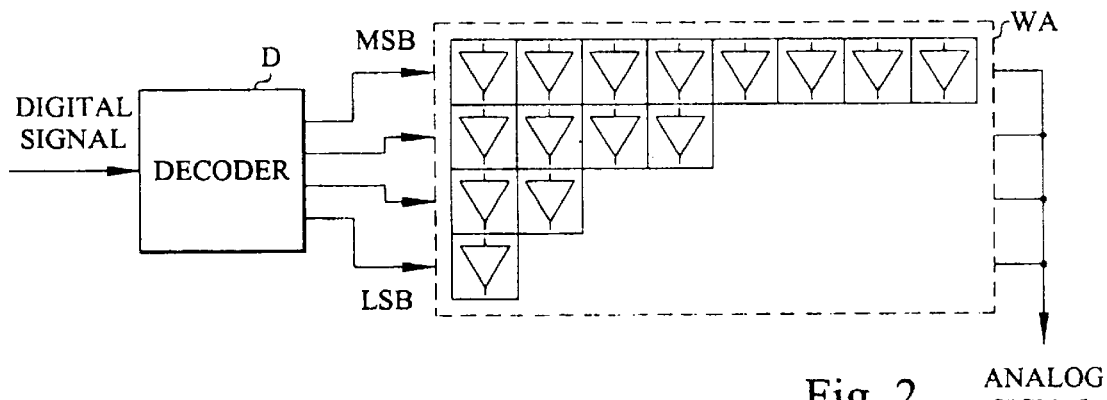
FIG. 2 is a block diagram illustrating the principles of an array-based exponentially weighted D/A converter.

A common practice is to implement the weights as a unit weight array, in which unit weights are combined to obtain the proper weights. FIG. 2 is a block diagram illustrating the principles of such an array-based exponentially weighted D/A converter. The figure illustrates how the unit weights are logically combined. In a practical implementation the array is rectangular. The samples of a digital signal are forwarded to a decoder D that transforms the samples into parallel binary signals that are forwarded to a unit weight array WA. The unit weights are logically arranged into linear unit weight blocks corresponding to the desired weight factors $2^k$. Each individual bit will turn on or off an entire unit weight block (in practice the bits will have to be further converted into control signals due to the rectangular arrangement of the unit weights).

Figure 3:
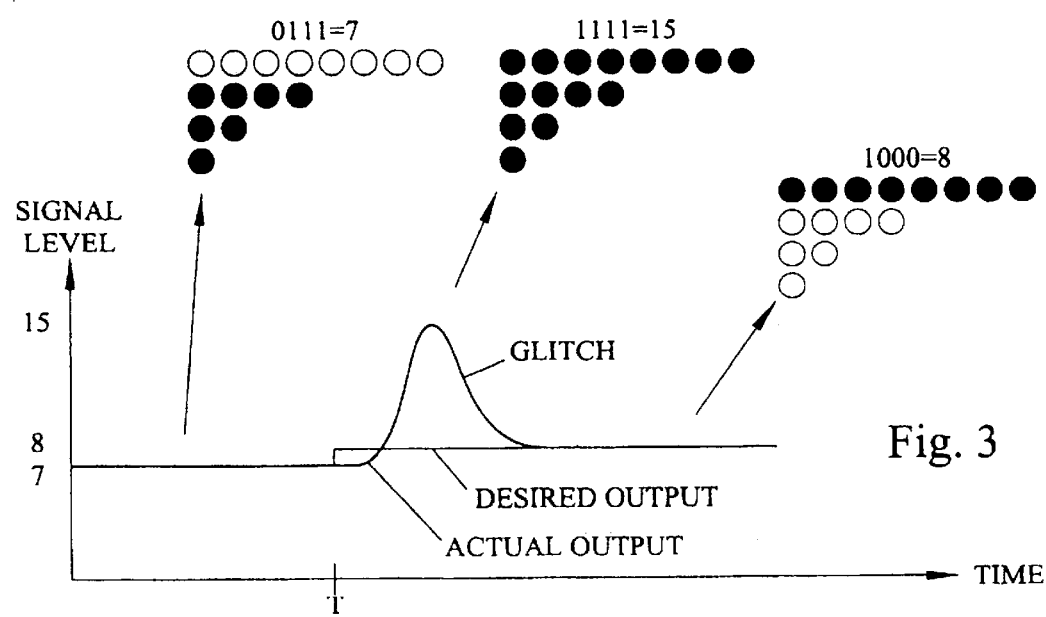
FIG. 3 is a diagram illustrating a problem with exponentially weighted D/A converters.

FIG. 3 is a diagram illustrating a problem with exponentially weighted D/A converters. The figure illustrates a transition from 0111=7 to 1000=8. This is called a major code transition, since all the bits are reversed. Since all unit weights may not switch at exactly the same time, there is a risk that all bits will have the value 1 during a short transition time. This means that during a short time period the output signal will correspond to the maximum value 1111=15. This phenomenon is called a glitch. Thus, the actual output signal will have spikes at such major code transitions (another possibility is that the output signal temporarily corresponds to the value 0000=0 during the transition, which leads to the same problem). The problem becomes more and more disturbing as the D/A conversion frequency is increased (since the time periods in which the output signal is stable will be shorter and shorter). Thus, at high frequencies these glitches become a frequency-limiting factor.

For the general case of an N-bit D/A converter the maximum number of switched unit weights between two consecutive exponentially weighted binary codes is $$S_E = 2^{N-1} + (2^{N-1} - 1) = 2^N - 1$$

Hence, in the worst case all unit weights are switched. For a 14 bit D/A converter this results in switching of $2^{14} - 1 = 16383$ unit weights.

Various modifications of the exponentially weighted. D/A converter intended to reduce this problem have been suggested. Some examples will now be described with reference to FIGS. 4–9.

Figure 4:
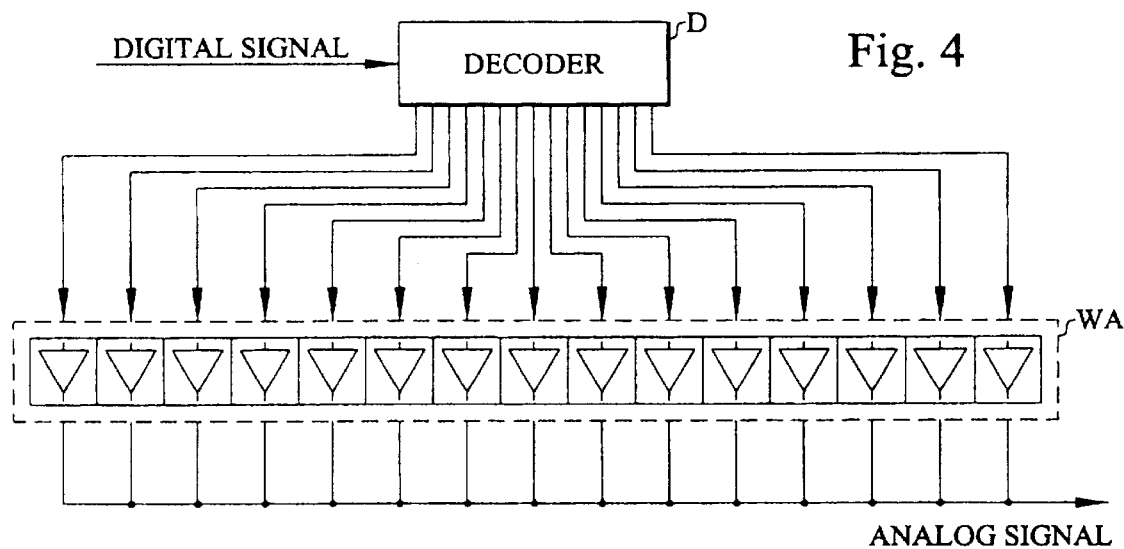
FIG. 4 is a block diagram illustrating the principles of an array-based unary weighted D/A converter.

FIG. 4 is a block diagram illustrating the principles of an array-based unary weighted D/A converter. In this converter the unit weights are logically arranged into independently switched unit weights. This embodiment implements what is referred to as temperature weighting or unary weighting. The analog output signal x may be written as $$x = \sum_{k=1}^{2^N} x[k] \cdot 1$$

The advantage of a unary weighted D/A converter is that a change from one binary value to a neighboring value will only imply a change in one unit weight. This is illustrated in FIGS. 5-a and 5-b, where the same transition from 0111=7 to 1000=8 only turns on another unit weight. However, a major drawback of the unary weighted D/A converter is that it requires an enormous amount ($2^N$) of control lines. The number of control lines may be reduced if the unit weights are arranged into a rectangular array. However, a rectangular weight array requires a more complex decoder and also unit weights with at least two control inputs and corresponding control logic.

Figure 6:
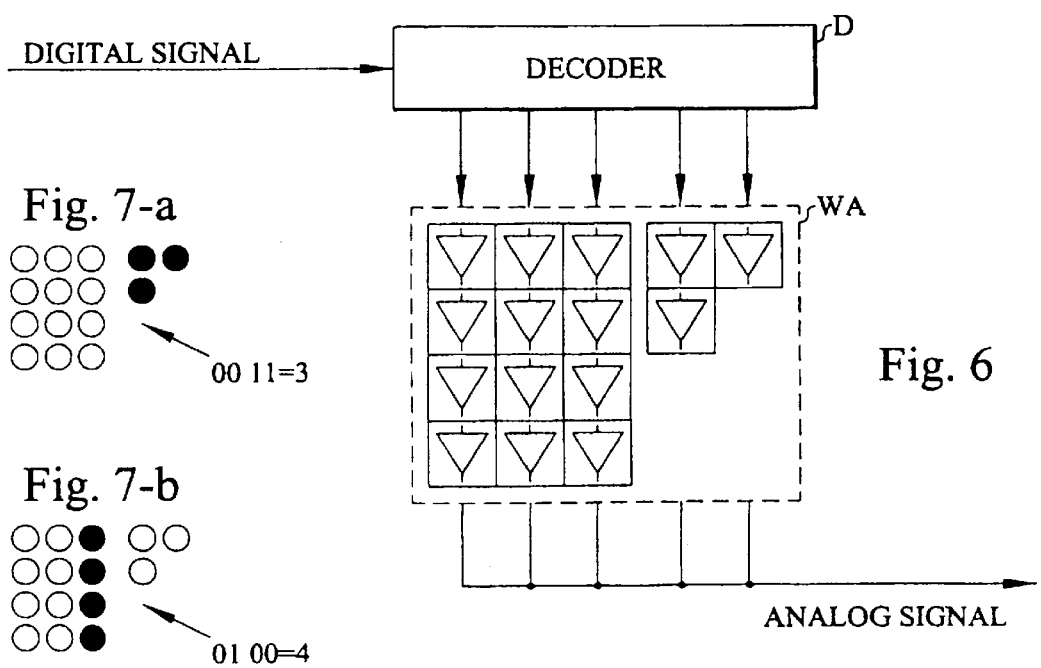
FIG. 6 is a block diagram illustrating the principles of an array-based segmented D/A converter.

Another approach that has been suggested is the segmented D/A converter. FIG. 6 is a block diagram illustrating the principles of an array-based segmented D/A converter. In this converter the most significant bits are handled in the same way as in a unary weighted converter, while the least significant bits are handled as in an exponentially weighted converter. In FIG. 6 the two most significant bits control 3 weight blocks, each comprising 3 unit weights, in the same way as in FIG. 4, while the two least significant bits control the remaining 3 unit weights in the same way as in FIG. 2. In this embodiment a major code transition occurs between 0011=3 and 0100=4, as illustrated in FIGS. 7-a and 7-b. Generally such a transition occurs at the border between the two segments.

FIG. 8 is a block diagram illustrating the principles of another array-based segmented D/A converter. The difference with respect to the embodiment of FIG. 6 lies in the way the least significant bits are handled. In this embodiment unary weighting instead of exponential weighting is used for these bits. The behavior at a major code transition is the same as in the embodiment of FIG. 6, as illustrated in FIGS. 9-a and 9-b.

Since the segmentation requires a complex decoder, it is desirable to keep the number of segmented bits as low as possible. The complexity is also increased by the necessary rectangular arrangement of the unit weights, which requires at least two inputs and extra control logic in each unit weight.

For the general case of an N-bit segmented D/A converter having K segmented bits the maximum number of switched unit weights between two consecutive codes (major code transition) occurs at the boundary between segmented and non-segmented bits, and may be expressed as $$S_S = 2^{N-K} + (2^{N-K} - 1) = 2^{N-K+1} - 1$$

As an example, for a 14-bit segmented D/A converter with segmentation of the 6 most significant bits, one obtains $S_S = 2^{14-6+1} - 1 = 511$ unit weights.

The present invention is based on a linearly weighted representation of the digital input signal. Thus, the analog output signal x is expressed as $$x = \sum_{k=1}^{n} x[k] \cdot k$$

where n is an integer that is determined in accordance with the procedure described below. FIG. 10 is a block diagram illustrating the principles of an array-based linearly weighted D/A converter in accordance with the present invention. As in the exponentially weighted D/A converter each control signal x[k] turn on or off an entire block (column in this case) of unit weights. However, according to the present invention the blocks represent the linear weights k instead of the exponential weights $2^k$. This arrangement has several advantages, as will be explained below.

FIGS. 11-$a$–11-$b$ illustrate a major code transition in the linearly weighted D/A converter of FIG. 10. This occurs at the transition between the two largest blocks of unit weights.

The integer n that determines the size of the triangular weight array WA of the D/A converter in accordance with the present invention is calculated as follows. The number of unit weights in a triangular array WA is $$\frac{n(n+1)}{2}$$

Implementation of an N-bit D/A converter requires $$2^N - 1$$

levels or unit weights. Since this should be equal to the number of unit weights in the triangular array, one obtains $$\frac{n(n+1)}{2} = 2^N - 1$$

which may be written as $$n^2 + n - 2 \cdot (2^N - 1) = 0$$

The (positive) root n of this equation is $$n = -\frac{1}{2} + \sqrt{\frac{1}{4} + 2 \cdot (2^N - 1)}$$

Since this expression involves a square root, the calculated value n may not be an integer. In such a case the nearest higher integer is used in order to guarantee that all levels of the digital signal may be realized.

For large N, for example N>10–12 bits, the above expression for n may be approximated as $$n \approx 2^{\frac{N+1}{2}}$$

For the general case of an N-bit linearly weighted D/A converter in accordance with the present invention the maximum number of switched unit weights between two consecutive codes (major code transition) occurs at the transition between the two largest blocks of unit weights, and may be expressed as $$S_L = n + (n-1) = 2n - 1 \approx 2^{\frac{N+3}{2}}$$

For a 14-bit D/A converter this gives $S_L$=362 unit weights.

A comparison with the exponentially weighted D/A converter gives (for large N)

$$\frac{S_E}{S_L} \approx \frac{2^N}{2^{\frac{N+3}{2}}} = 2^{\frac{N-3}{2}}$$

This expression implies that $S_E > S_L$ if N>3. Since it was assumed that N is large, for example N>10–12 bits, this condition is fulfilled. Thus, for all cases of practical interest the linearly weighted D/A converter in accordance with the present invention has better glitch performance than an exponentially weighted D/A converter.

A comparison with the segmented D/A converter gives (for large N)

$$\frac{S_S}{S_L} \approx \frac{2^{N-K+1}}{2^{\frac{N+3}{2}}} = 2^{\frac{N-1}{2}-K}$$

This expression implies that the linearly weighted D/A converter in accordance with the present invention has better glitch performance than a segmented D/A converter as long as $$K < \frac{N-1}{2}$$

As an example, a 14-bit segmented D/A converter would require as much as K=7 segmented bits to have better glitch performance than the linearly weighted D/A converter in accordance with the present invention. Such a converter would, however, be very complex.

Figure 12:
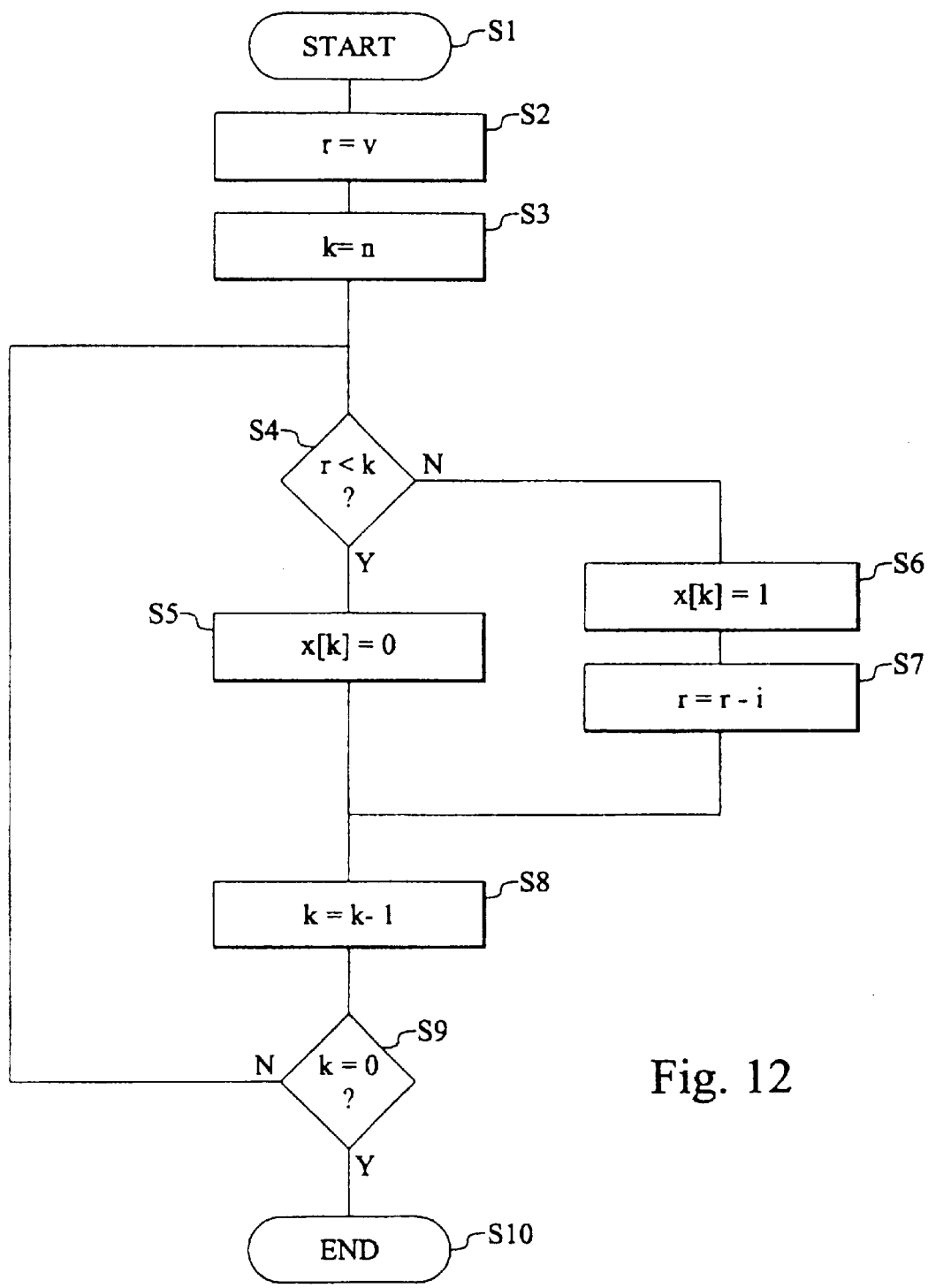
FIG. 12 is a flow chart illustrating an exemplary algorithm for determining linear weights in a D/A converter in accordance with the present invention.

FIG. 12 is a flow chart illustrating an exemplary algorithm for determining linear weights in a D/A converter in accordance with the present invention. The algorithm starts in step S1. Step S2 sets a help variable r equal to the value v of an incoming digital sample. Step S3 sets a loop variable k equal to the length n of the longest unit weight block in the triangular unit weight array WA. Step S4 tests whether r>k. If so, control signal x[k] is set to 0 in step S5, which means that all the unit weights in column k in FIG. 10 are turned off. Otherwise control signal x[k] is set to 1 in step S6, which means that all the unit weights in column k in FIG. 10 are turned on, and r is decremented by 1 in step S7. In step S8 loop variable k is decremented by 1. Step S9 tests whether k=0. If so, the algorithm ends in step S10. Otherwise the algorithm loops back to step S4. FIGS. 13-$a$–13 -$p$ illustrate all possible unit weight array configurations resulting from this algorithm for a 4-bit linearly weighted D/A converter in accordance with the present invention.

Figure 14:
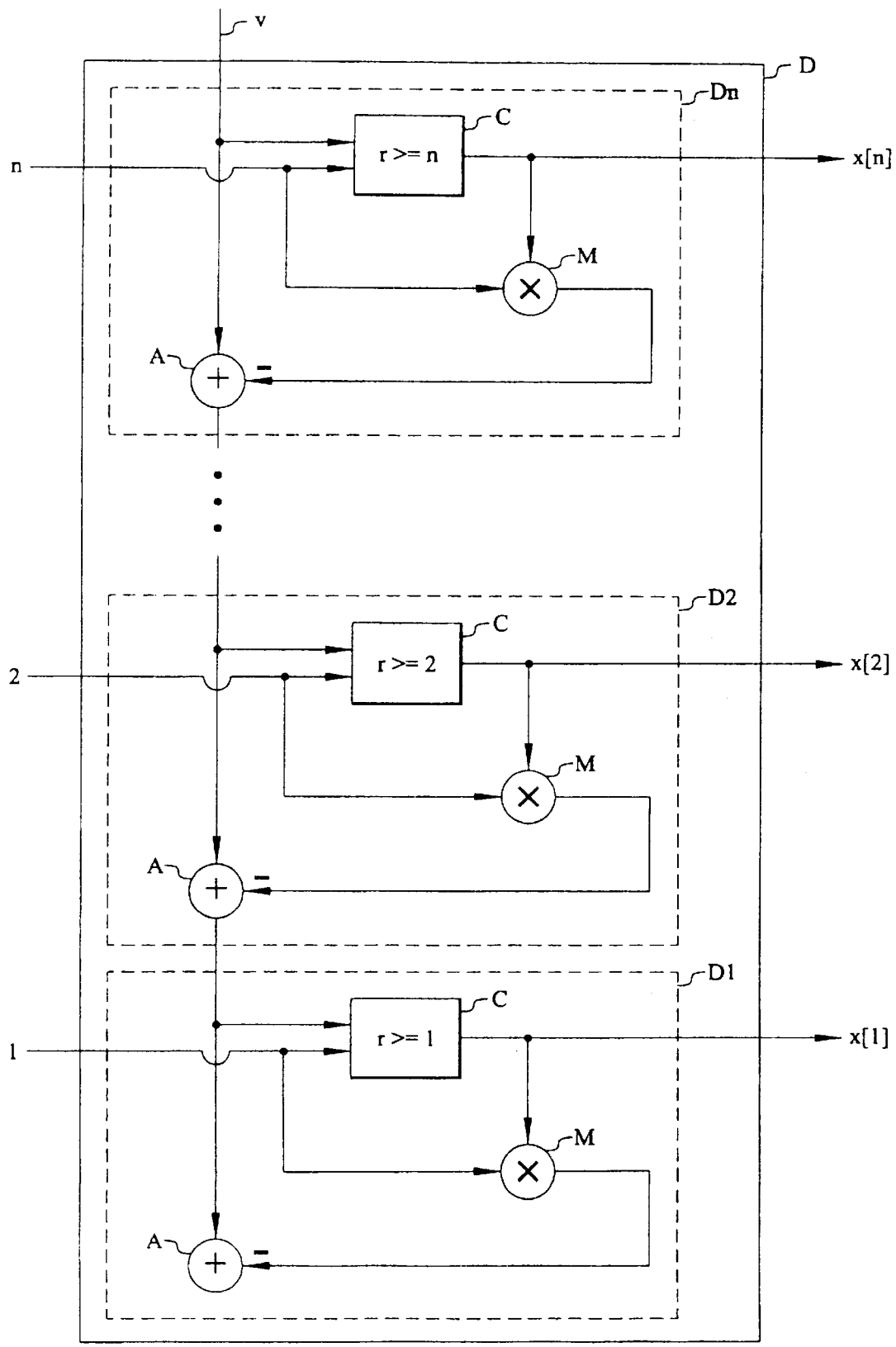
FIG. 14 is a block diagram of a decoder suitable for implementing the algorithm of FIG. 12.

FIG. 14 is a block diagram of an exemplary decoder suitable for implementing the algorithm of FIG. 12. The decoder D receives a sample v of the digital signal to be converted on an input line. The decoder comprises a number of decoder units D1, D2, . . . , Dn. Each decoder unit comprises a comparator C, a multiplier M and an adder A. In the uppermost decoder unit Dn the help signal r (which in this case is equal to v) is tested against the value n in comparator C. If r>=n control signal x[n] will be 1, otherwise it will be 0. The value of x[n] is multiplied by n in multiplier M, and the result is subtracted from r in adder A. The output signal from adder A is forwarded to the next decoder unit, where the same operations are performed on the new r-value, but this time the value n−1 is forwarded to the other input of comparator C. The same operations are repeated all the way down to decoder unit D1. The result is the control signal vector x[1], x[2], . . . , x[n].

In the embodiment of FIG. 10 entire unit weight columns were either turned on or off. However, it is appreciated that an equivalent embodiment could be obtained by turning entire unit weight rows on or off. In fact, this feature could at a very low extra cost be used to implement an embodiment containing redundancy. Redundancy in this context means that the same code may activate different unit weight combinations to obtain the same analog output signal. The advantage of redundancy is that systematic errors due to minor differences between the individual unit weights may be statistically reduced by randomly selecting different unit weight combinations for the same digital value.

Figure 15:
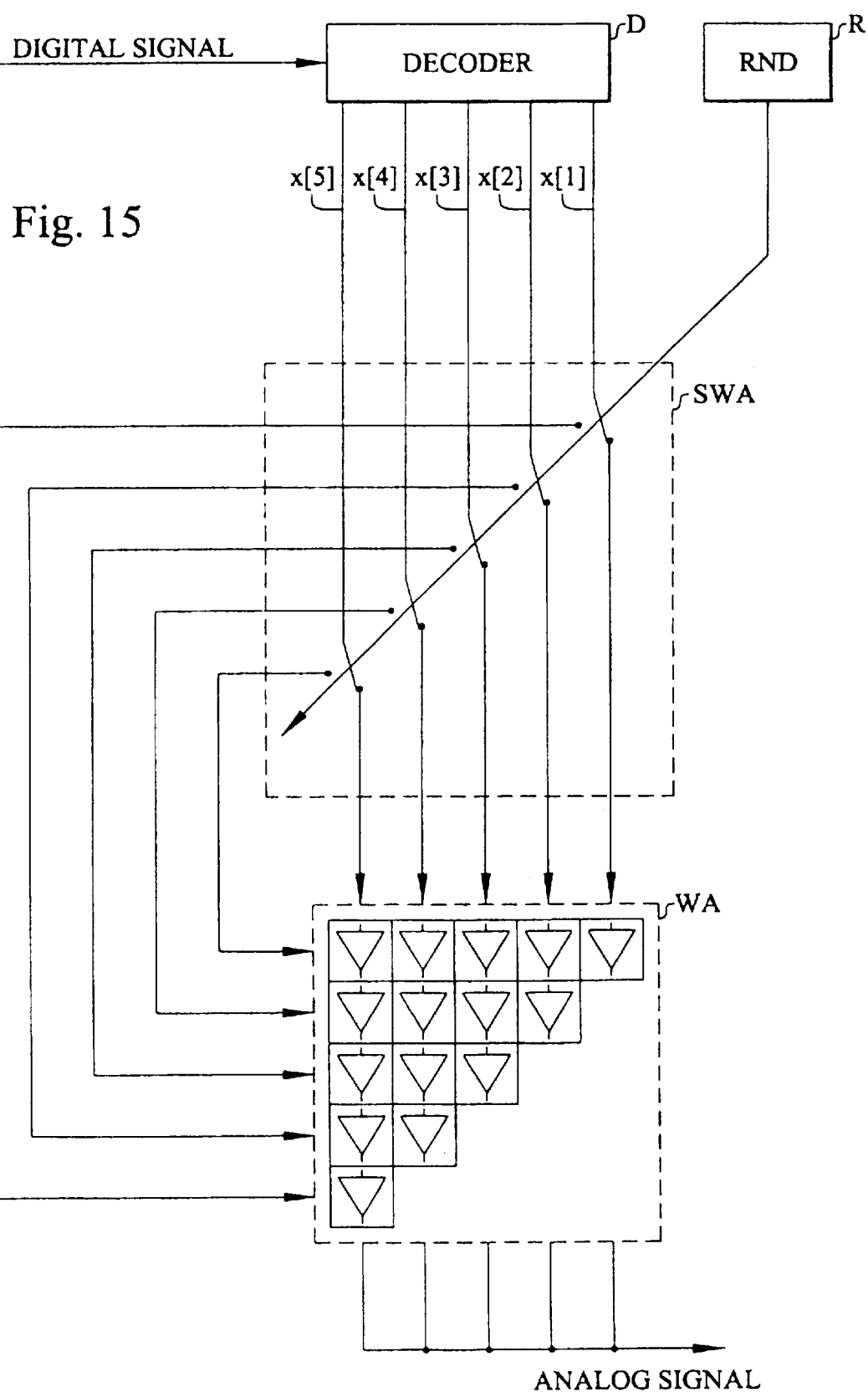
FIG. 15 is a diagram illustrating an exemplary embodiment of an array-based linearly weighted D/A converter in accordance with the present invention providing redundancy.

FIG. 15 is a diagram illustrating an exemplary embodiment of an array-based linearly weighted D/A converter in accordance with the present invention providing such redundancy. A switch array SWA switches the control signals x[k] between column-wise and row-wise activation of the unit weight array WA. The switching may, for example, be controlled by a random number generator R, which generates a switch control signal that varies randomly between two values. Another alternative is to simply let the switch array SWA alternate between the two possible switch configurations (this embodiment is based on the fact that the digital input signal itself may usually be considered as a random signal). It is noted that both embodiments may still use the same decoder as in the embodiment in FIG. 10 without redundancy. The modifications are only in the weight array, which now has two inputs. This will be further described with reference to FIG. 17.

Another way to obtain redundancy is to activate either rows or columns, but to combine the rows or columns in different ways. For example, in the 4-bit embodiment of FIG. 10 the digital number 7 can be realized as 5+2 (FIG. 13-h), but it may also be realized as 4+3, which will activate different columns (or rows if a row based embodiment is used). This embodiment will require a more complex decoder, but will not require any modifications to the unit weight array.

A combination of the methods for obtaining redundancy is of course also possible.

Figure 16:
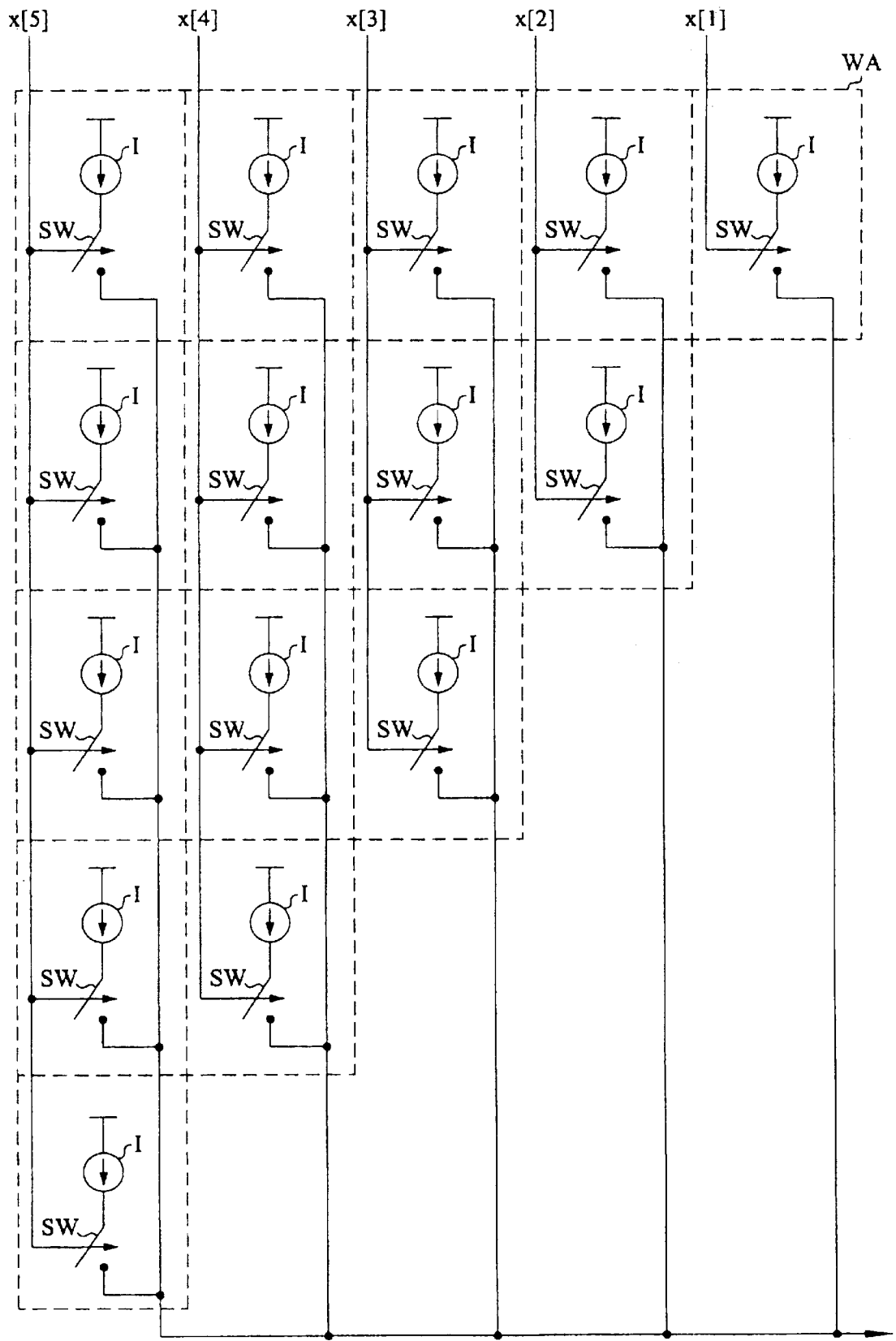
FIG. 16 is a block diagram of an exemplary embodiment of a unit weight array in a D/A converter in accordance with the present invention.

FIG. 16 is a block diagram of an exemplary embodiment of a unit weight array in a D/A converter in accordance with the present invention. This embodiment is suitable for a converter in accordance with FIG. 10 and uses single-ended switches. The unit weights of the array WA have been indicated by dashed lines. In this exemplary embodiment each unit weight comprises a current source I and a switch SW. The switches are controlled by control signals x[1], ..., x[5]. Each control signal simultaneously controls all switches SW in one column. The outputs from each unit weight in a column are added, and finally the outputs of each column are added to form the analog signal.

Figure 17:
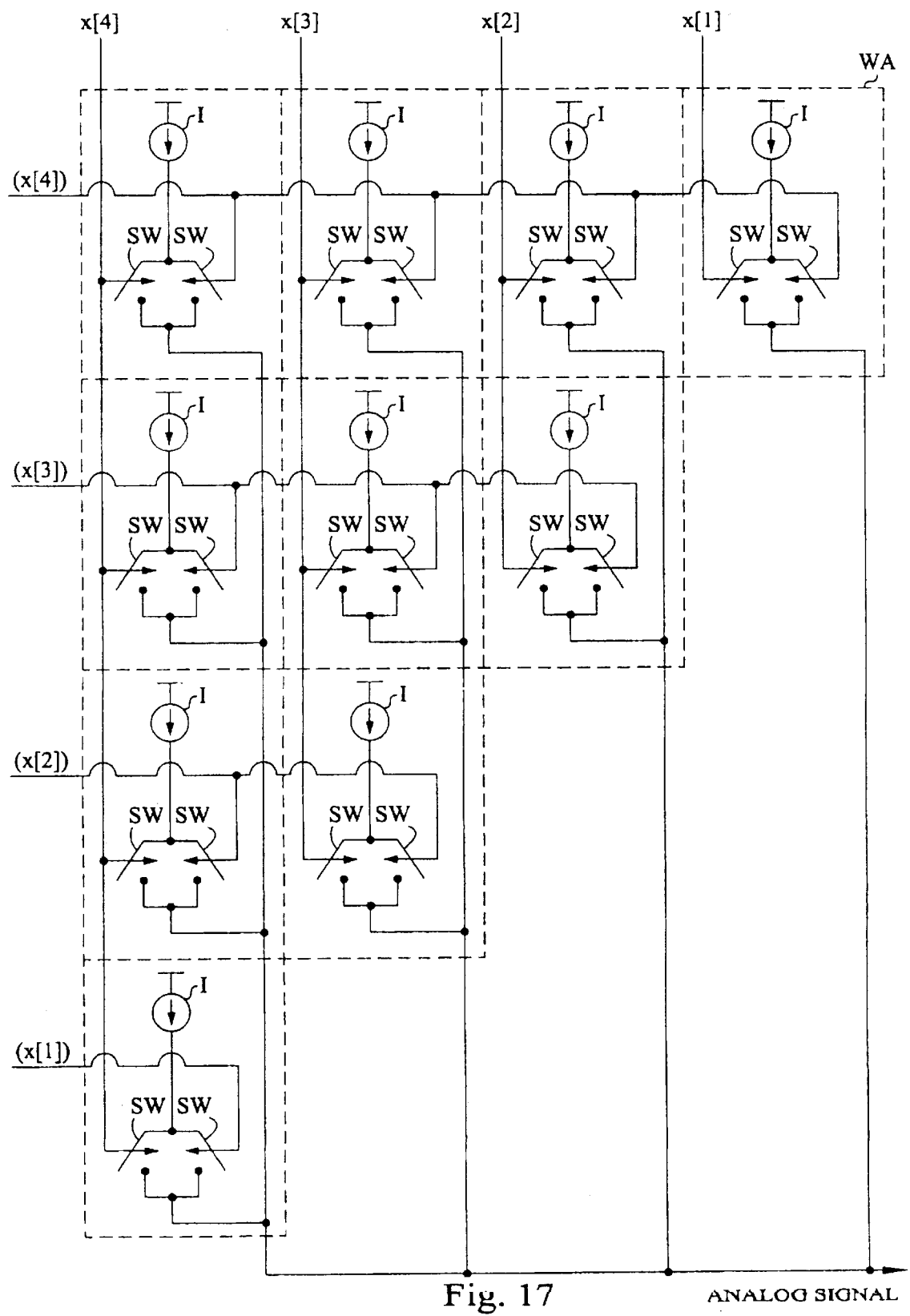
FIG. 17 is a block diagram of a redundancy providing exemplary embodiment of a unit weight array in a D/A converter in accordance with the present invention.

FIG. 17 is a block diagram of a redundancy providing exemplary embodiment of a unit weight array in a D/A converter in accordance with the present invention. This embodiment is suitable for a converter in accordance with FIG. 15. In this embodiment the bit resolution has been reduced to 3 bits to reduce cluttering of the figure. The difference compared to FIG. 16 is that each unit weight now contains two parallel switches SW, one for column activation (as in FIG. 16) and one for row activation. The same set of control signals x[1], ..., x[4] are forwarded to the unit weight array WA for either column or row activation. This has been indicated in the figure by putting a parenthesis around the control signals to the row switches.

Figure 18:
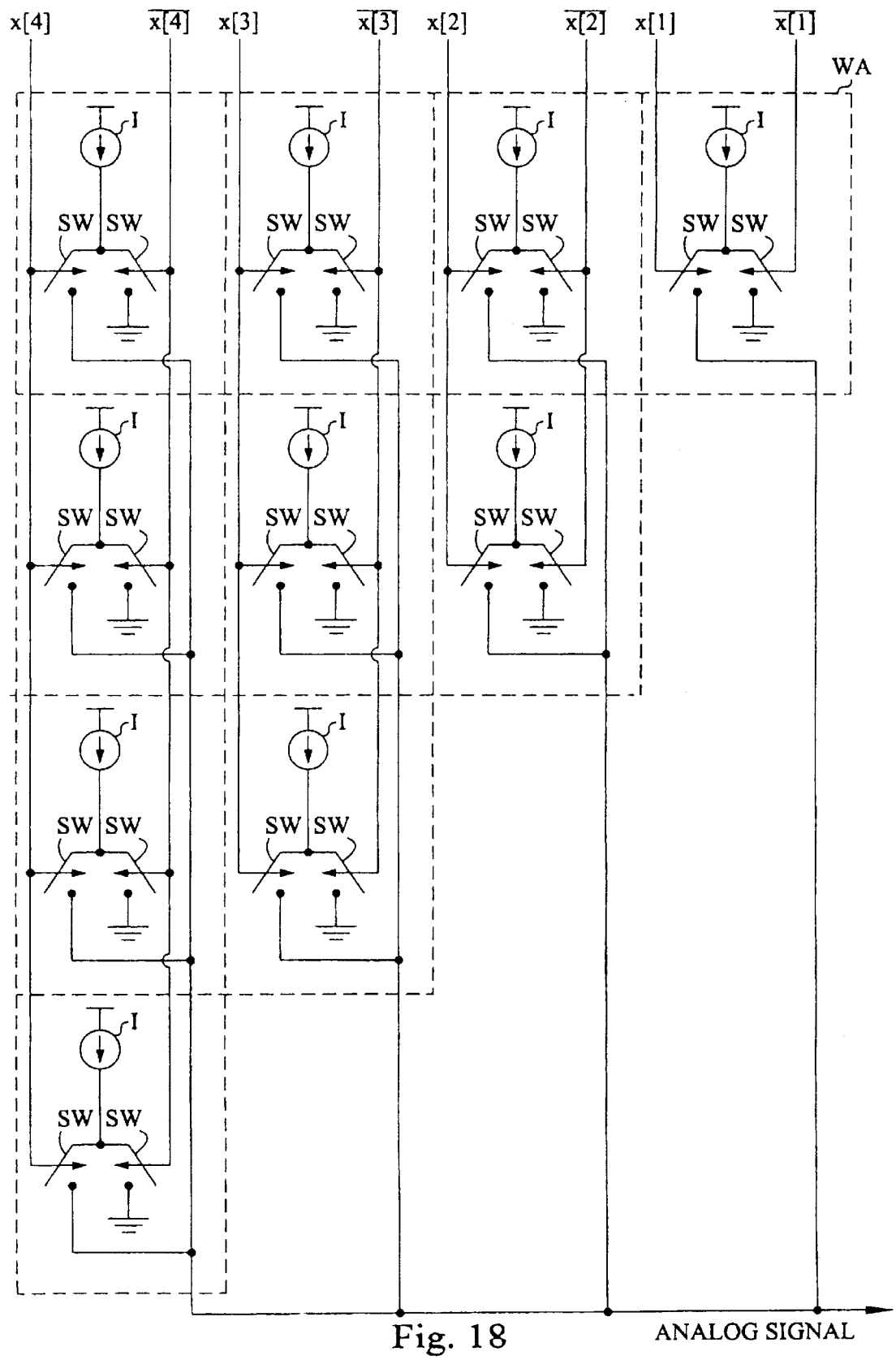
FIG. 18 is a block diagram of an exemplary embodiment of a differential implementation of a unit weight array in a D/A converter in accordance with the present invention.

FIG. 18 is a block diagram of an exemplary embodiment of a differential implementation of a unit weight array in a D/A converter in accordance with the present invention. This embodiment is suitable for a converter in accordance with FIG. 10. The differential embodiment is similar to the embodiment of FIG. 16. The difference is that in addition to each control signal x[k] the inverted control signal is also used. The control signal and its inverse each control a corresponding switch connected to the current source in a unit weight. The outputs from the switches controlled by the inverted control signals are grounded. The result will be that all unit weights will be turned on at all times, but not all of them are connected to the output line. The control signals x[1], ..., x[4] will activate some columns, while the remaining columns will be grounded by the inverted control signals. The advantage of this embodiment is that it avoids the case of an unconnected current source output. If the output of the current source is unconnected, as in the case of FIG. 16, the voltage level at the source output will drift to the supply voltage and hence when the switch turns on there will be a large voltage difference over the switch. This would also imply a large charge transfer, which is similar to the behavior of a glitch. A differential embodiment corresponding to the embodiment of FIG. 17 is of course also possible.

Typically the current sources and switched in the embodiments of FIGS. 16–18 are implemented by CMOS transistors in a manner that is well known in the art. Examples of single-ended and differential implementation of unit weights are, for example, described in the previously cited "Integrated Analog Circuit Design", by Johns and Martin.

It will be understood by those skilled in the art that various modifications and changes may be made to the present invention without departure from the scope thereof, which is defined by the appended claims.

What is claimed is:

1. A D/A conversion method, comprising the steps of:
   logically arranging unit weights into a right-angled triangular unit weight array;
   transforming digital samples into control signals having a linearly weighted binary representation;
   using said control signals for activation/deactivation of entire rows or columns of said triangular unit weight array; and
   combining said unit weights into an analog output signal.

2. The method of claim 1, including the step of providing redundancy by switching between a column mode, in which only entire columns are activated/deactivated, and a row mode, in which only entire rows are activated/deactivated.

3. The method of claim 1, including the step of providing redundancy by activating/deactivating entire rows or columns in different configurations having the same total number of unit weights.

4. A D/A converter, comprising:
   a unit weight array having unit weights that are logically arranged into a right-angled triangle;
   a decoder for transforming digital samples into control signals having a linearly weighted binary representation;
   means for using said control signals for activation/deactivation of entire rows or columns of said unit weight array; and
   means for combining said unit weights into an analog output signal.

5. The D/A converter of claim 4, comprising means for providing redundancy by switching between a column mode, in which only entire columns are activated/deactivated, and a row mode, in which only entire rows are activated/deactivated.

6. The D/A converter of claim 4, comprising means for providing redundancy by activation/deactivation of entire rows or columns in different configurations having the same total number of unit weights.

7. The D/A converter of claim 4, wherein said unit weights are implemented by single-ended switches.

8. The D/A converter of claim 4, wherein said unit weights are implemented by differential switches.

* * * * *